(12) United States Patent
Edelstein et al.

(10) Patent No.: US 9,870,993 B1
(45) Date of Patent: *Jan. 16, 2018

(54) SIMULTANEOUS FORMATION OF LINER AND METAL CONDUCTOR

(71) Applicant: International Business Machines Corporation, Armonk, NY (US)

(72) Inventors: Daniel C Edelstein, White Plains, NY (US); Chih-Chao Yang, Glenmont, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/217,429

(22) Filed: Jul. 22, 2016

(51) Int. Cl.
*H01L 21/02* (2006.01)
*H01L 23/532* (2006.01)
*H01L 21/768* (2006.01)
*H01L 21/321* (2006.01)
*H01L 23/528* (2006.01)

(52) U.S. Cl.
CPC .. *H01L 23/53223* (2013.01); *H01L 21/02178* (2013.01); *H01L 21/02247* (2013.01); *H01L 21/3212* (2013.01); *H01L 21/7684* (2013.01); *H01L 21/76822* (2013.01); *H01L 21/76843* (2013.01); *H01L 21/76864* (2013.01); *H01L 21/76882* (2013.01); *H01L 23/528* (2013.01); *H01L 23/53209* (2013.01); *H01L 23/53252* (2013.01); *H01L 21/02252* (2013.01); *H01L 21/02255* (2013.01)

(58) Field of Classification Search
None
See application file for complete search history.

(56) References Cited

U.S. PATENT DOCUMENTS

| 6,197,683 B1 | 3/2001 | Kang et al. |
| 6,337,289 B1 | 1/2002 | Narwanker et al. |
| 6,383,943 B1 | 5/2002 | Chen et al. |

(Continued)

OTHER PUBLICATIONS

List of IBM Patents or Patent Applications Treated As Related.

(Continued)

*Primary Examiner* — Long Pham
(74) *Attorney, Agent, or Firm* — Jeffrey S LaBaw; Steven J Meyers

(57) ABSTRACT

An advanced metal conductor structure and a method for constructing the structure are described. A method for fabricating an advanced metal conductor structure provides a conductive line pattern including a set of conductive line trenches in a dielectric layer. Each conductive line trench of the conductive line pattern has parallel vertical sidewalls and a horizontal bottom. A surface treatment of the dielectric layer is performed. The surface treatment produces an element enriched surface layer in which a concentration of a selected element in a surface portion of the parallel sidewalls and horizontal bottoms of the conductive line trenches is increased. A metal layer is deposited on the element enriched surface layer. A thermal anneal process is then performed which simultaneously reflows the metal layer to fill the conductive line trenches and causes a chemical change at interfaces of the metal layer and the element enriched surface layer creating a liner which is an alloy of the metal and selected element. Another aspect of the invention is a device which is created by the method.

9 Claims, 5 Drawing Sheets

(56) References Cited

U.S. PATENT DOCUMENTS

| | | |
|---|---|---|
| 6,844,258 B1 | 1/2005 | Fair et al. |
| 7,535,066 B2 | 5/2009 | Rotondaro et al. |
| 8,013,446 B2 | 9/2011 | Yang et al. |
| 8,420,531 B2 | 4/2013 | Yang et al. |
| 8,530,320 B2 | 9/2013 | Yang et al. |
| 8,673,779 B1 | 3/2014 | Yoon |
| 2011/0057317 A1 | 3/2011 | Koike |
| 2013/0214411 A1 | 8/2013 | Kim et al. |
| 2013/0292806 A1 | 11/2013 | Ma |
| 2015/0333012 A1 | 11/2015 | Chang |
| 2016/0276150 A1 | 9/2016 | Xue |

OTHER PUBLICATIONS

J. A. Wilks et al., "Nitridation of organo-silicate glass: A self-limiting process for PVD Ta 1+ x N/Ta barrier formation," Applied Surface Science, vol. 255, No. 23, 2009, pp. 9543-9547.
IBM Patents or Patent Applications Treated As Related.

SIMULTANEOUS FORMATION OF LINER AND METAL CONDUCTOR

BACKGROUND OF THE INVENTION

This disclosure relates to integrated circuit devices, and more specifically, to a method and structure to create advanced metal conductor structures in semiconductor devices.

As the dimensions of modern integrated circuitry in semiconductor chips continues to shrink, conventional lithography is increasingly challenged to make smaller and smaller structures. With the reduced size of the integrated circuit, packaging the chips more closely together becomes important as well. By placing chips closer to each other, the performance of the overall computer system is improved.

It is typical to deposit a liner material prior to the deposition of a metal for forming a conductive line layer in semiconductor devices. In some applications, the liner material prevents the metal from diffusing into an underlying dielectric. However, as the dimensions of the features continue to shrink, the liner material takes up an increasing amount of the cross-section allocated to the conductive line. As the liner material is not as conductive as the metal, and conductivity at small cross-section dimensions is challenging, it would be advantageous to develop new technologies that reduce the effect of the liner material on conductivity.

BRIEF SUMMARY

According to this disclosure, an advanced metal conductor structure and a method for constructing the structure are described. In one aspect of the invention, a method for fabricating an advanced metal conductor structure provides a conductive line pattern including a set of conductive line trenches in a dielectric layer. Each conductive line trench of the conductive line pattern has parallel vertical sidewalls and a horizontal bottom. A surface treatment of the dielectric layer is performed. The surface treatment produces an element enriched surface layer in which a concentration of a selected element in a surface portion of the parallel sidewalls and horizontal bottoms of the conductive line trenches is increased. A metal layer is deposited on the element enriched surface layer. A thermal anneal process is then performed which simultaneously reflows the metal layer to fill the conductive line trenches and causes a chemical change at interfaces of the metal layer and the element enriched surface layer creating a liner which is an alloy of the metal and selected element. Another aspect of the invention is a device which is created by the method.

The foregoing has outlined some of the more pertinent features of the disclosed subject matter. These features should be construed to be merely illustrative. Many other beneficial results can be attained by applying the disclosed subject matter in a different manner or by modifying the invention as will be described.

BRIEF DESCRIPTION OF THE DRAWINGS

For a more complete understanding of the present invention and the advantages thereof, reference is now made to the following descriptions taken in conjunction with the accompanying drawings which are not necessarily drawing to scale, and in which.

DETAILED DESCRIPTION OF THE DRAWINGS

Figure 1:
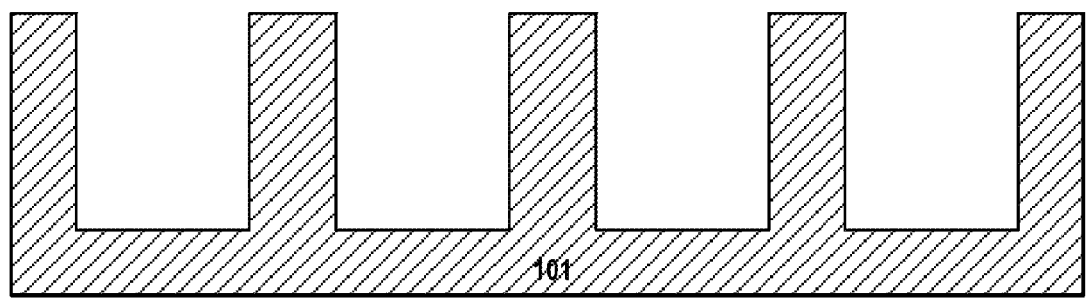
FIG. 1 is a cross-sectional diagram depicting the substrate structure after patterning and etching steps have been performed according to a first embodiment of the invention.

At a high level, the invention provides a method and resulting structure to form liner and conductor simultaneously in order to minimize the physical thickness of the liner, and thereby the liner cross-section portion of the total cross-section of the conductive line. In embodiments of the invention, this is achieved by performing a surface treatment of the patterned dielectric prior to metal deposition. In the conventional interconnect process, barrier liner(s) and conducting material are deposited separately. Also, physical thickness of the barrier liner(s) reduce(s) the volume fraction of the total conducing area, which becomes a critical issue as the feature dimensions gets smaller in the modern technology nodes.

A "substrate" as used herein can comprise any material appropriate for the given purpose (whether now known or developed in the future) and can comprise, for example, Si, SiC, SiGe, SiGeC, Ge alloys, GaAs, InAs, InP, other III-V or II-VI compound semiconductors, or organic semiconductor structures. Insulators can also be used as substrates in embodiments of the invention.

For purposes herein, a "semiconductor" is a material or structure that may include an implanted impurity that allows the material to sometimes be conductive and sometimes be a non-conductive, based on electron and hole carrier concentration. As used herein, "implantation processes" can take any appropriate form (whether now known or developed in the future) and can comprise, for example, ion implantation.

For purposes herein, an "insulator" is a relative term that means a material or structure that allows substantially less (<95%) electrical current to flow than does a "conductor." The dielectrics (insulators) mentioned herein can, for example, be grown from either a dry oxygen ambient or steam and then patterned. Alternatively, the dielectrics herein may be formed from any of the many candidate high dielectric constant (high-k) materials, including but not limited to hafnium oxide, aluminum oxide, silicon nitride, silicon oxynitride, a gate dielectric stack of $SiO_2$ and $Si_3N_4$, and metal oxides like tantalum oxide that have relative dielectric constants above that of $SiO_2$ (above 3.9). The dielectric can be a combination of two or more of these materials. The thickness of dielectrics herein may vary contingent upon the required device performance. The conductors mentioned herein can be formed of any conductive material, such as polycrystalline silicon (polysilicon), amorphous silicon, a combination of amorphous silicon and polysilicon, and polysilicon-germanium, rendered conductive by the presence of a suitable dopant. Alternatively, the conductors herein may be one or more metals, such as tungsten, hafnium, tantalum, molybdenum, titanium, or nickel, or a metal silicide, any alloys of such metals, and may be deposited using physical vapor deposition, chemical vapor deposition, or any other technique known in the art.

When patterning any material herein, the material to be patterned can be grown or deposited in any known manner and a patterning layer (such as an organic photoresist a.k.a. "resist") can be formed over the material. The patterning layer (resist) can be exposed to some form of light radiation (e.g., patterned exposure, laser exposure) provided in a light exposure pattern, and then the resist is developed using a chemical agent. This process changes the characteristic of the portion of the resist that was exposed to the light. Then one portion of the resist can be rinsed off, leaving the other portion of the resist to protect the material to be patterned. A material removal process is then performed (e.g., plasma etching) to remove the unprotected portions of the material to be patterned. The resist is subsequently removed to leave the underlying material patterned according to the light exposure pattern.

For purposes herein, "sidewall structures" are structures that are well-known to those ordinarily skilled in the art and are generally formed by depositing or growing a conformal insulating layer (such as any of the insulators mentioned above) and then performing a directional etching process (anisotropic) that etches material from horizontal surfaces at a greater rate than its removes material from vertical surfaces, thereby leaving insulating material along the vertical sidewalls of structures. This material left on the vertical sidewalls is referred to as a sidewall structure. The sidewall structures can be used as masking structures for further semiconducting processing steps.

Embodiments will be explained below with reference to the accompanying drawings.

FIG. 1 is a cross-sectional diagram depicting the substrate structure after patterning and etching steps have been performed according to a first embodiment of the invention. As is known, a photoresist or sacrificial mandrel layer can be patterned over a dielectric layer. The subsequent etch will create the substrate structure depicted in FIG. 1. The dielectric layer 101 is silicon dioxide in preferred embodiments, however, other dielectric materials are used in other embodiments of the invention. Further, the dielectric layer 101 is preferably part of a multilayer structure comprising a plurality of materials. The conductive line pattern is a set of trenches formed in the dielectric 101 which have a set of vertical sidewalls and a set of horizontal bottoms. For ease in illustration, the trenches 102 which have been etched into the substrate are shown with a fairly low aspect ratio (H/D) of height (=H) to width (=D). In some embodiments of the invention the range of aspect ratios is 0.5 to 20 with aspect ratios of 1 to 10 being preferred. However, in the actual device, there may be high aspect ratios (Height/width) which are greater than 20:1. A typical range of heights of the dielectric conductive line pattern (or depths of the trenches) is from 100 nanometers to 2 micrometers and a typical range of width of an individual trench is 5 nanometers to 1 micrometers.

Figure 2:
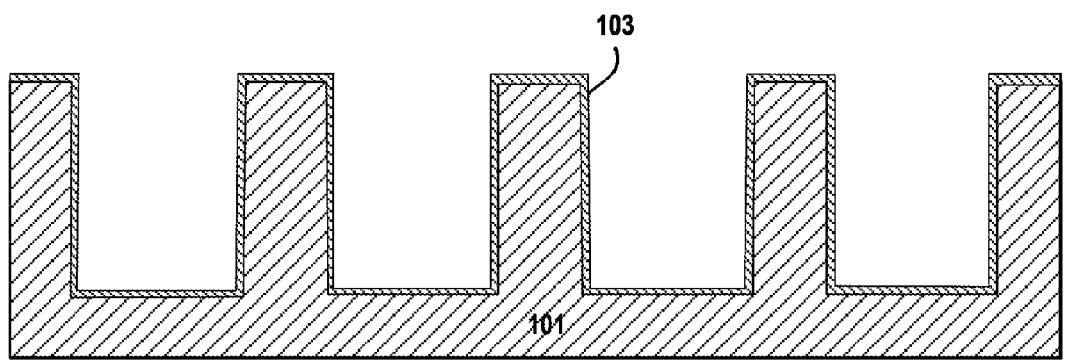
FIG. 2 is a cross-sectional diagram depicting the substrate structure after a surface treatment step has been performed according to a first embodiment of the invention.

FIG. 2 is a cross-sectional diagram depicting the structure after a surface treatment step has been performed according to a first embodiment of the invention. In the drawing, a surface treatment has been performed on the dielectric substrate resulting in an element enriched surface layer 103. The element enriched surface layer 103 is created on the sidewalls and bottom of the dielectric utilizing a plasma or thermal process which increases the concentration of a selected element in a surface portion of the dielectric. It is important to note that the treatment of the surface portion of the dielectric takes place in the dielectric layer itself and takes little, if any, additional cross-section. In one preferred embodiment, the surface treatment is a nitridation process and results in the formation of a nitrogen-enriched dielectric surface. The nitridation process is performed as a substitute to the deposition of a traditional liner material. Since the nitrogen-enriched dielectric surface takes little to no cross section from the trench cross-section and is instead formed from the dielectric material, a greater cross-section can be devoted to the metal of the conductive lines as compared to prior art methods of protecting the dielectric from the diffusion of the metal of the conductive lines.

The thermal nitridation process employed in embodiments of the present invention disclosure does not include an electrical bias higher than 200 W in a nitrogen-containing gas or gas mixture. The nitrogen-containing gases that can be employed in the present invention include, but are not limited to, N2, NH3, NH4, NO, and NHx wherein x is between 0 and 1 or mixtures thereof. In some embodiments, the nitrogen-containing gas is used neat, i.e., non-diluted. In other embodiments, the nitrogen-containing gas can be diluted with an inert gas such as, for example, He, Ne, Ar and mixtures thereof. In some embodiments, H2 can be used to dilute the nitrogen-containing gas. The nitrogen-containing gas employed in the present disclosure is typically from 10% to 100%, with a nitrogen content within the nitrogen-containing gas from 50% to 80% being more typical. In one embodiment, the thermal nitridation process employed in the present disclosure is performed at a temperature from 50° C. to 450° C. In another embodiment, the thermal nitridation process employed in the present disclosure is performed at a temperature from 100° C. to 300° C. for 30 minutes to 5 hours. In one set of embodiments, the resulting nitride enhanced layer is between 2 angstroms to 30 angstroms thick, but alternative embodiments can have thicknesses outside this range.

In some embodiments, a N2 plasma process is used to create the nitride layer which involves an electrical bias higher than 350 W. An N2 plasma can be controlled without damaging the dielectric with ion current density range: 50~2000 uA/cm2, and process temperature between 80 and 350 degrees C.

In other embodiments, other chemicals containing Si, C, and O or mixtures thereof can be used for the surface treatment. For example SiHx could be a source for Si, CHx could be a source for C, and O3 is a source for O. Both thermal and plasma techniques can be used for the treatment. The thickness of the element enriched layer 103 can vary according to the type of metal layer being formed and the technique used in forming the same. Typically, the layer 103 has a thickness from 2 angstroms to 10 nm, with a thickness from 1 nm to 3 nm being more typical. The element enriched layer 103 prevents the diffusion of the subsequent metal layer into the dielectric.

Figure 3:
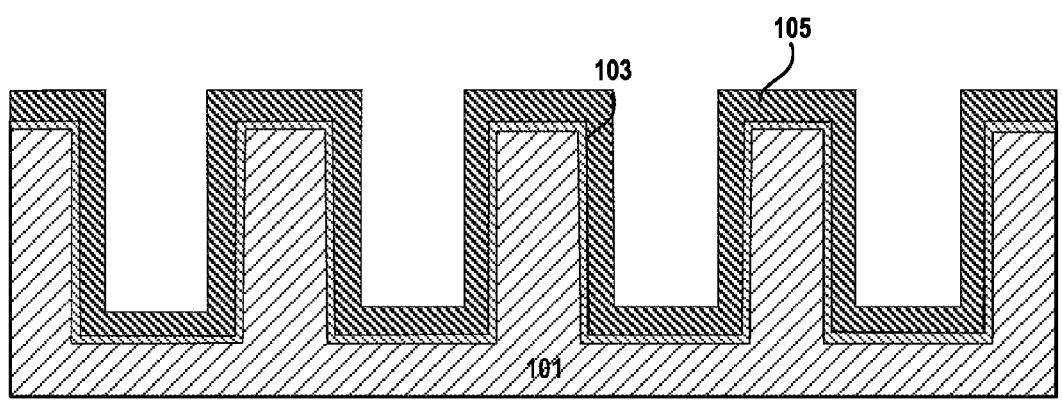
FIG. 3 is a cross-sectional diagram depicting the structure after a metal deposition step has been performed according to a first embodiment of the invention.

FIG. 3 is a cross-sectional diagram depicting the structure after a metal deposition step has been performed according to a first embodiment of the invention. Metals such as Al, Co, Ru, Ir, Rh, or Ni can be deposited in this step. ((Should there be combinations of the metals as well??)) In one preferred embodiment, Al is used. The aluminum layer 105 (or alternative metal) can be formed by a conventional deposition process including, for example, chemical vapor deposition (CVD), plasma enhanced chemical vapor deposition (PECVD), atomic layer deposition (ALD), physical vapor deposition (PVD), sputtering, chemical solution deposition and plating. In preferred embodiments, the thickness of the Al layer 105 is at least sufficient to fill the trench area after a subsequent thermal anneal step reflows the Al layer.

In preferred embodiments, the thickness of the Al layer will be in the range of 10 nm to 2000 nm, with a thickness from 30 nm to 800 nm being more typical. As illustrated, the metal deposition is substantially conformal over the element enriched layer 103, however, a conformal layer is not a requirement of the invention.

Figure 4:
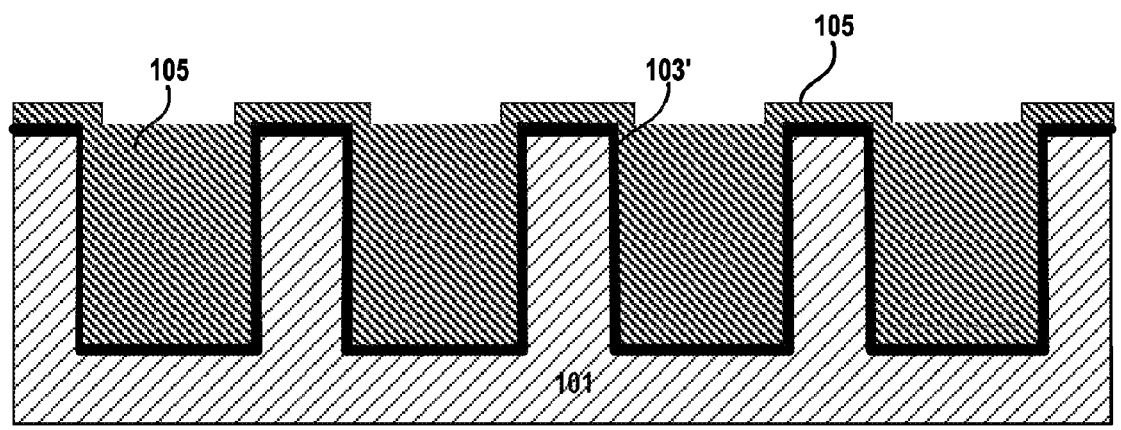
FIG. 4 is a cross-sectional diagram depicting the structure after a thermal anneal step has been performed according to a first embodiment of the invention.

FIG. 4 is a cross-sectional diagram depicting the structure after a thermal anneal step has been performed according to a first embodiment of the invention according to an embodiment of the invention. The surface treatment step described above forms the element enriched layer 103, wherein a selected element's concentration has been enhanced in the dielectric. The thermal anneal creates a chemical change at the interface between the Al layer 105 and the element enriched layer 103 creating an alloy liner 103' of Al and the selected element. In alternative embodiments, an alloy of the selected metal and the selected element is formed. For example, if a nitridation process was performed and the deposited metal is Al, an aluminum nitride layer 103' such as AlN is formed by the anneal. If the dielectric material 101 contains Si, a silicon containing aluminum nitride liner layer 103' such as Al(N, Si) is formed. Alternatively, if the dielectric material 101 does not contain Si, but the chemical used for the surface treatment contains both N and Si, an Al(N, Si) liner layer 103' is also formed. In the general case, if C is the selected element in the embodiment and M is the deposited metal, an MC liner layer 103' is formed.

In one preferred embodiment, the thermal anneal is carried out in a furnace between a temperature range between 100-500 degrees Centigrade in a neutral ambient, for example, in an N2, H2, He ambient or a mixture thereof. The thermal anneal is carried out for a period of 30 minutes to 5 hours in embodiments of the invention. In another embodiment, the thermal anneal is carried out through laser annealing. 20 nanoseconds to 5 minutes, 300-900 degrees Centigrade using a similar ambient.

The thermal anneal also reflows the aluminum (or other selected metal in other embodiments) from the field area into the patterned conductive line features due to capillary driving force. Thus, the thermal anneal step simultaneously forms both a new type of protective liner, for example, Al(N, Si), and the conductor lines (by reflow). The reflow process not only forms an Al—N liner simultaneously, but has better feature fill quality than the normal deposition. Because the liner is disposed in the cross section allocated to the dielectric layer, there is a greater cross-section allocated to the conductive line. The deeper the feature the more challenge for metal fill, i.e. manufacturability.

Figure 5:
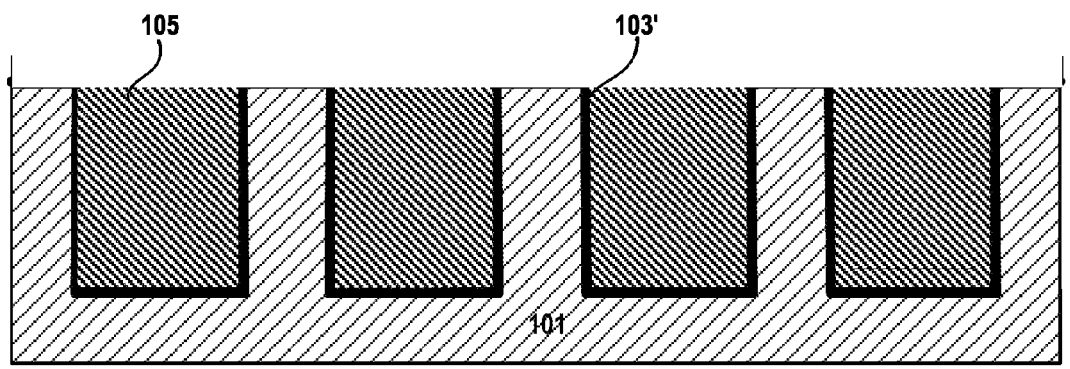
FIG. 5 is a cross-sectional diagram depicting the structure after a planarization step has been performed according to a first embodiment of the invention.

FIG. 5 is a cross-sectional diagram depicting the structure after a planarization step has been performed according to a first embodiment of the invention. The drawing depicts the structure after a planarization process such as a chemical mechanical polishing (CMP) step has been performed according to a first embodiment of the invention. Typically, a CMP process uses an abrasive and corrosive chemical slurry (commonly a colloid) in conjunction with a polishing pad. The pad and wafer are pressed together by a dynamic polishing head and held in place by a plastic retaining ring. As shown, the CMP step has removed the excess portions of the aluminum layer 105 in the field areas of the dielectric layer outside the trenches of conductive line pattern in the dielectric 101. In preferred embodiments of the invention, the liner layer is also removed from the field areas of the dielectric where it is not needed. Other planarization processes are known to the art and are used in alternative embodiments of the invention.

Processing of additional layers of the integrated circuit device proceeds after the steps illustrated in the disclosure. For example, a second set of conductive lines could be created using an embodiment of the invention in subsequent steps if required for completion of the integrated circuit.

Although the embodiment described above has mostly been described in terms of a nitridation process to change the surface of the dielectric layer and aluminum as the metal fill material for the conductive lines, the reader should understand that any permutation of a surface treatment using N, Si, C, and O or mixtures thereof and of Al, Co, Ru, Ir, Rh, or Ni or mixtures thereof for the first fill metal is possible for embodiments of the invention depending on the conductive characteristics desired for the conductive line and the composition of the dielectric substrate. Some combinations of metal and selected element, in addition to Al(N, Si) and AlN, which are desirable in different embodiments of the invention include Co (N, Si), Rh (N, Si), Ru (N, Si) and Ni (N, Si).

The resulting structure can be included within integrated circuit chips, which can be distributed by the fabricator in wafer form (that is, as a single wafer that has multiple chips), as a bare die, or in a packaged form. In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

While only one or a limited number of features are illustrated in the drawings, those ordinarily skilled in the art would understand that many different types of features could be simultaneously formed with the embodiment herein and the drawings are intended to show simultaneous formation of multiple different types of features. However, the drawings have been simplified to only show a limited number of features for clarity and to allow the reader to more easily recognize the different features illustrated. This is not intended to limit the invention because, as would be understood by those ordinarily skilled in the art, the invention is applicable to structures that include many of each type of feature shown in the drawings.

While the above describes a particular order of operations performed by certain embodiments of the invention, it should be understood that such order is exemplary, as alternative embodiments may perform the operations in a different order, combine certain operations, overlap certain operations, or the like. References in the specification to a given embodiment indicate that the embodiment described may include a particular feature, structure, or characteristic, but every embodiment may not necessarily include the particular feature, structure, or characteristic.

In addition, terms such as "right", "left", "vertical", "horizontal", "top", "bottom", "upper", "lower", "under", "below", "underlying", "over", "overlying", "parallel", "perpendicular", etc., used herein are understood to be relative locations as they are oriented and illustrated in the drawings (unless otherwise indicated). Terms such as "touching", "on", "in direct contact", "abutting", "directly adjacent to", etc., mean that at least one element physically contacts another element (without other elements separating the described elements).

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

Having described our invention, what we now claim is as follows:

1. A method for fabricating an advanced metal conductor structure comprising:
    providing a conductive line pattern including a set of conductive line trenches in a dielectric layer, each conductive line trench of the conductive line pattern having parallel vertical sidewalls and a horizontal bottom;
    performing a surface treatment of the dielectric layer, the surface treatment producing an element enriched surface layer in which a concentration of a selected element in a surface portion of the parallel sidewalls and horizontal bottoms of the conductive line trenches is increased;
    depositing a metal layer on the element enriched surface layer; and
    performing a thermal anneal which simultaneously reflows the metal layer to fill the conductive line trenches and causes a chemical change at interfaces of the metal layer and the element enriched surface layer creating a liner which is an alloy of the metal and selected element.

2. The method as recited in claim 1 wherein the metal layer is comprised of aluminum and the selected element is nitrogen.

3. The method as recited in claim 2, wherein the surface treatment is a nitridation process which increases the concentration of nitrogen in the element enriched surface layer and the liner is comprised of an alloy selected from the group consisting of AlN and Al(N, Si).

4. The method as recited in claim 1, wherein the metal layer is comprised of a metal selected from the group consisting of Al, Co, Ru, Ir, Rh, and Ni.

5. The method as recited in claim 1, wherein the selected element is selected from the group consisting of N, Si, C, and O.

6. The method as recited in claim 2, wherein the thermal anneal is carried out in a furnace between a temperature range between 100-500 degrees Centigrade in a neutral ambient.

7. The method as recited in claim 2, further comprising removing excess aluminum on field areas of the dielectric layer using a planarization process.

8. The method as recited in claim 3, wherein the nitridation process is selected from the group of a plasma nitridation process and a thermal nitridation process.

9. The method as recited in claim 7, wherein the planarization process is a chemical mechanical polishing process.

\* \* \* \* \*